United States Patent [19]

Chun et al.

[11] Patent Number: 4,907,238
[45] Date of Patent: Mar. 6, 1990

[54] APPARATUS FOR THE EFFICIENT WAVELENGTH CONVERSION OF LASER RADIATION

[75] Inventors: Myung K. Chun, Vienna; Lew Goldberg, Fairfax, both of Va.; Joseph F. Weller, Fort Washington, Md.

[73] Assignee: United States of America as represented by the Secretary of the Navy, Washington, D.C.

[21] Appl. No.: 370,965

[22] Filed: Jun. 26, 1989

[51] Int. Cl.$^4$ .............................................. H01S 3/13
[52] U.S. Cl. ....................................... 372/32; 372/21; 372/22; 372/75
[58] Field of Search ................... 372/9, 21, 22, 32, 33, 372/69, 75, 97, 100, 101

[56] References Cited

U.S. PATENT DOCUMENTS

| | | | |
|---|---|---|---|
| 3,736,518 | 5/1973 | Anderson et al. | 372/75 |
| 4,330,721 | 5/1982 | Hauck et al. | 307/425 |
| 4,656,635 | 4/1987 | Baer et al. | 372/27 |
| 4,686,485 | 8/1987 | Goldberg et al. | 330/4.3 |
| 4,731,795 | 3/1988 | Clark et al. | 372/22 |
| 4,791,631 | 12/1988 | Baumert et al. | 372/22 |
| 4,808,789 | 2/1989 | Muncheryan | 219/121.6 |
| 4,809,291 | 2/1989 | Byer et al. | 372/75 |

OTHER PUBLICATIONS

Publication, Second-Harmonic Generation at 421 nm Using Injection-Locked GaAlAs Laser Array and KNbO$_3$, by M. K. Chun et al., Appl. Phys. Lett. 53 (13), pp. 1170–1171, Sept. 26, 1988.
Publication, Nonlinear Optical Effects in KNbO$_3$ Crystals at Al$_x$Ga$_{1-x}$As, Dye, Ruby and Nd:YAG Laser Wavelengths, by J. C. Baumert et al., Proceedings of 1984 European Conference on Optics, Optical Systems and Applications, Spie V. 492, pp. 374–385, 9–12, Oct., 1984.
Publication, High Efficiency Second-Harmonic Generation in KNbO$_3$ Crystals, by J. C. Baumert et al., Optics Communications, Vol. 48, No. 3, pp. 215–220 (Dec. 1, 1983).
Publication, Single Lobe Operation of a 40-Element Laser Array in an External Ring Laser Cavity, by L. Goldberg et al., Appl. Phys. Lett. 51 (12), pp. 871–873 (Sept. 21, 1987).
Publication, Miniaturized Light Source of Coherent Blue Radiation, by T. Taniuchi et al., Conference on Lasers and Electro-Optics, Paper WP6 OSA/IEEE, Baltimore, MD., Apr. 26–May 1, 1987.

*Primary Examiner*—William L. Sikes
*Assistant Examiner*—B. R. R. Halloway
*Attorney, Agent, or Firm*—Thomas E. McDonnell; George Jameson

[57] ABSTRACT

An apparatus for generating coherent radiation at a desired frequency is disclosed. In a preferred embodiment the apparatus comprises: an injection-locked semiconductor diode structure having a large active area for emitting a diffraction-limited beam at a preselected frequency; optics for focusing the diffraction-limited beam into a focused beam; a nonlinear crystal responsive to the focused beam for producing a beam of laser power which includes an output beam at a desired harmonic of the preselected frequency; and a device for passing the output beam in a given direction. In a modification of the preferred embodiment, the output of the injection-locked semiconductor diode structure is mixed with an emission from a laser source in the nonlinear crystal to produce a desired sum or difference frequency.

21 Claims, 2 Drawing Sheets

APPARATUS FOR THE EFFICIENT WAVELENGTH CONVERSION OF LASER RADIATION

BACKGROUND OF THE INVENTION

1. Field of the Invention

The present invention relates to lasers and particularly to the efficient generation of laser radiation by the frequency conversion of the output of an injection-locked diode laser structure which has a large active area.

2. Description of the Prior Art

The direct frequency doubling of a diode laser output promises to be the most efficient method of generating coherent blue emission (in the exemplary 390 to 440 nm spectral range). Unfortunately, second-harmonic generation (SHG) efficiency, using diode lasers, has been limited in the past by their relatively low available power output. The highest SHG powers obtained with a diode laser source and a single pass optical configuration, using a potassium niobate ($KNbO_3$) crystal as a frequency doubler, were 0.28 micro watts for continuous wave (CW) operation and 0.35 milliwatts for pulsed operation, as disclosed in the published article of J.-C. Baumert et al., "High Efficiency Second-Harmonic Generation In $KNbO_3$ Crystals", Optics Communications, Vol. 48, No. 3, pp. 215-220 (Dec. 1, 1983).

OBJECTS OF THE INVENTION

Accordingly, one object of the invention is to efficiently generate visible radiation by the second harmonic conversion of a high-power, diffraction limited, injection-locked, diode laser array wavelength in a nonlinear crystal, such as $KNbO_3$.

Another object of the invention is to provide an apparatus for the efficient wavelength conversion of laser radiation from an injection-locked diode laser array.

Another object of the invention is to efficiently generate laser radiation by the frequency conversion of the output of an injection-locked diode laser structure which has a large active area for emitting a diffraction-limited beam at a preselected frequency.

Another object of the invention is to provide an apparatus for the efficient wavelength conversion of laser radiation from an injection-locked broad stripe diode laser.

Another object of the invention is to efficiently generate laser radiation by the frequency conversion of the output of a broad stripe diode laser.

Another object of the invention is to provide for the efficient generation of laser radiation by the frequency conversion of the diffraction-limited output of a diode array amplifier structure which is injected with the diffraction-limited output beam from a master laser.

Another object of the invention is to efficiently generate laser radiation by the frequency conversion of the output of an injection-locked diode laser array operating at a wavelength of approximately 840 nm.

Another object of the invention is to efficiently generate light in the approximate spectral range of 390–440 nm.

A further object of the invention is to provide for the efficient frequency doubling in $KNbO_3$ of the diffraction-limited emission output of an externally injection-locked GaAlAs diode laser array.

SUMMARY OF THE INVENTION

These and other objects are achieved in the present invention by providing an apparatus which comprises an injection-locked semiconductor diode structure having a large active area for emitting a diffraction-limited beam at a preselected frequency, optics for focusing the diffraction-limited beam into a focused beam, a nonlinear crystal responsive to the focused beam for producing a beam of laser power which includes an output beam at a desired frequency, and a device for separating the output beam from the rest of the beam of laser power.

The injection-locked semiconductor diode structure can be a semiconductor diode laser array, a broad stripe laser diode or a diode array amplifier structure. Each of these types of injection-locked semiconductor diode structures has a large active area for emitting the diffraction-limited beam. Typically, this large active area would be on the order of 50 micrometers, or larger, in width.

BRIEF DESCRIPTION OF THE DRAWINGS

These and other objects, features and advantages of the invention, as well as the invention, itself, will become better understood by reference to the following detailed description when considered in connection with the accompanying drawings wherein like reference numerals designate identical or corresponding parts throughout the several views and wherein.

DETAILED DESCRIPTION OF THE PREFERRED EMBODIMENT

Figure 1:
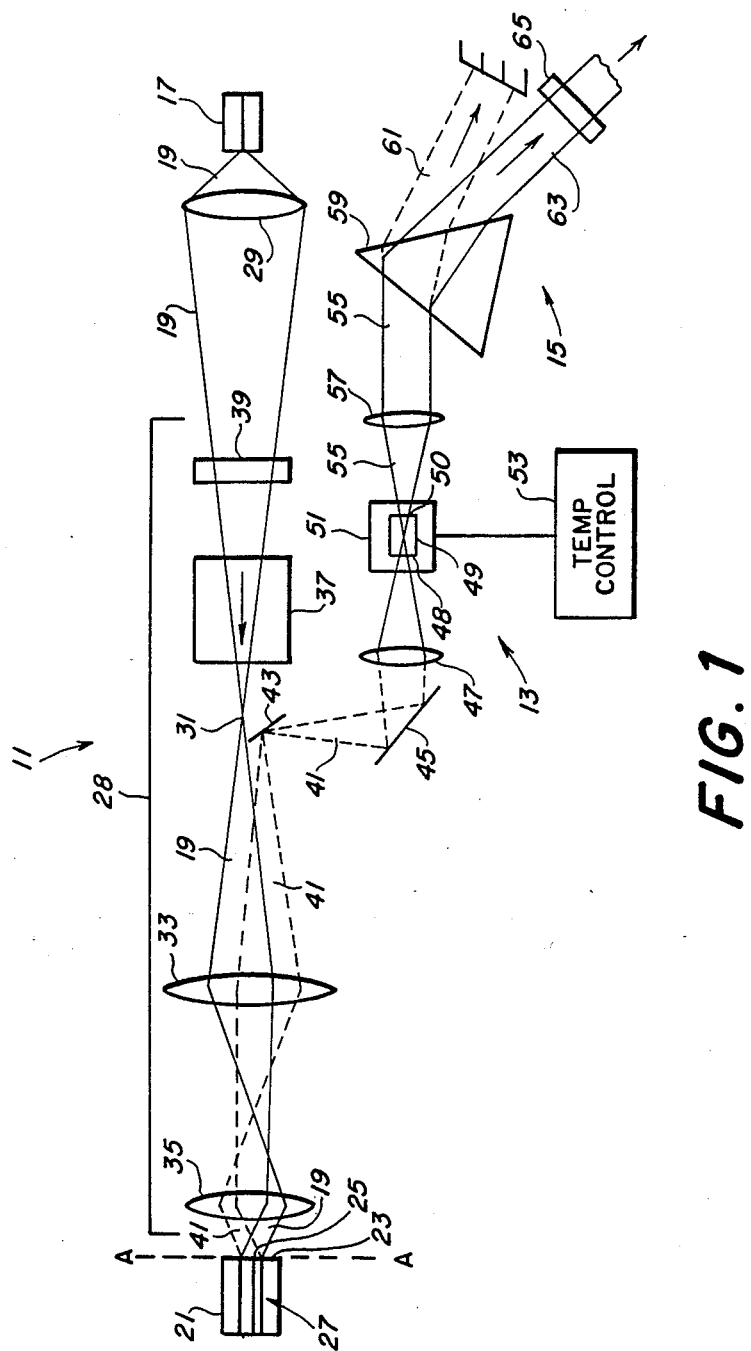
FIG. 1 illustrates a preferred embodiment of the invention.

Referring now to FIG. 1, a preferred embodiment of the invention is shown. The apparatus of FIG. 1 includes a power amplification section 11, a frequency multiplication section 13 and a filter section 15. Essentially, the apparatus of FIG. 1 efficiently generates exemplary second harmonic power by frequency-multiplying the high-power, diffraction-limited output power of an injection-locked diode laser array in a nonlinear crystal, such as potassium niobate ($KNbO_3$). Nonlinear crystals are well known in the art and can be used for frequency harmonic generation and/or frequency mixing, as will be subsequently discussed.

The power amplification section 11 is comprised of a single stripe, single-mode master laser (ML) 17 that produces a laser beam 19 at a preselected frequency or wavelength, a semiconductor diode laser array 21 having a facet 23 and a junction plane AA (represented by dashed line AA) where the ends 25 of stripes 27 are exposed, and an optical configuration or means 28 for shaping and focusing the laser beam 19 so that the beam 19 irradiates the junction plane AA, causing the laser array 21 to be injection-locked.

In the injection-locked condition, the spectrum and far field intensity distribution of the laser array 21 are controlled by the master laser 17. The output of the injection-locked laser array 21 has a single spectral mode, and its emission is diffraction-limited so that in the far field the intensity is contained in a single narrow lobe. Furthermore, the output of the array 21 has a spectral linewidth equal to that of the master laser 17. Since the master laser 17 has a linewidth which is much smaller than that of the uninjected array 21, the linewidth of the injection-locked array 21 thus is considerably less than that of the free running master laser 17.

Injection-locking of the laser array 21 is achieved by irradiating the junction plane AA with the laser beam 19 produced by the master laser 17. The beam 19 incident on the ends 25 of the exposed stripes 27 must be narrow in one direction and wide in the other direction to approximate the shape of the junction plane AA on the edge of the array facet 23 and focused thereon. The optical configuration or means 28 shapes the beam 19 into the edge of the shape of the junction plane AA and focuses the shaped beam 19 onto the edge of the junction plane AA. This is the essential feature to achieve injection locking, and the placement of the master laser 17 and the optical configuration or means 28 is of secondary importance. See the publication "Injection Locking in AlGaAs Semiconductor Laser", S. Kobayashi and T. Kimura, IEEE J. Quantum Electronics, Vol. QE-17, No. 5, pp. 681–689 (May 1981), for a more detailed explanation of injection locking.

The only exception to the previous statement that the placement of the master laser 17 (with respect to the laser array 21) is of secondary importance is that, in order to maximize the power contained in the single narrow lobe, the incident beam should be directed at an angle of about 4 degrees to the normal of the array facet 23. At high array output powers, single lobe operation of the injection-locked array 21 occurs only with the injected laser beam 19 incident at an angle of approximately 4 degrees to the normal of the facet 23.

The optical configuration or means 28 for shaping and focusing the laser beam 19 can be comprised of: a focusing lens 29 that focuses the laser beam 19 from the master laser 17 to a point 31 before the beam 19 starts to diverge; a cylindrical lens 33 that narrows the diverging beam in the plane parallel to the junction plane AA of the array 21 to approximately the length of the junction plane AA of the array 21, but leaves unchanged the diverging beam along the plane perpendicular to the junction plane AA; and a focusing lens 35 which receives the shaped beam from the cylindrical lens 33 and focuses it into the junction plane AA. After passing though the lens 29, 33 and 35, the beam 19 has essentially the same length and height as the junction plane AA of the array 21.

The optical configuration or means 28 can also include a Faraday isolator 37 and a half-wave plate 39. Faraday isolator 37 rotates the polarization direction of the beam 19 from the master laser 17 by 45 degrees in an exemplary counter-clockwise (CCW) direction and also prevents undesired feedback of light or radiation from the laser array 21 back into the master laser 17. The half-wave plate 39 rotates the polarization of the laser beam 19 from the master laser by 45 degrees in an exemplary clockwise (CW) direction to compensate for the 45 degree CCW rotation of the beam 19 by the Faraday isolator 37.

The injection locking of the array 21 causes the phase of light or radiation emitted by each of the strips 27 of the array 21 to be essentially in phase with every other stripe 27. As a result, the far field intensity distribution or pattern of the injection-locked array 21 is single lobed, with the width of the lobe equal to the diffraction limit of the aperture width (not shown) of the emitting array 21. Moreover, in the injection-locked array 21 the phase of the light being emitted by the laser array is relatively constant as a function of time. The result is an output from the array 21 that is single-moded.

For a more detailed explanation of the optical injection locking of diode laser arrays, see U.S. Pat. No. 4,686,485. The material in this patent is incorporated by reference into the present application.

It should be noted at this time that the master laser 17 can be a GaAlAs single-stripe, single-mode, Hitachi HLP 1400 laser mounted on a thermoelectric cooler (not shown) for temperature control. This master laser 17 is temperature-controlled to emit radiation at, for example, a wavelength of 840 nm (nanometers). In addition, the semiconductor diode laser array 21 can be a 20-element GaAlAs gain guided array, manufactured by Spectral Diode Labs with part number SDL 4450C.

Upon being injection-locked by an exemplary incident 10 milli watt externally injected beam from the master laser 17, the laser array 21 operates at a wavelength of 840 nm and emits a total output power of approximately 300 mW (milliwatts).

The single lobe far-field emission from the array 21 has 70–80% of the emission confined to a single diffraction-limited lobe or beam 41. This single-lobe, diffraction-limited beam 41 has a diffraction-limited width and is centered at an angle offset by about 4 degrees from the normal (not shown) to the facet 23 in the junction plane AA. The off-normal angle offset of the lobe or beam 41 is equal in magnitude and opposite in polarity to that of the input injected laser beam 19. As a result, the array 21 operates in an off-axis reflective amplifier mode of operation.

The approximate 8 degree angular separation between the input laser beam 19 to the array 21 and the output single-lobe, diffraction-limited beam 41 from the array 21 allows for the spatial separation of these beams. The reflective amplifier operation of the array 21 enables the set of lenses, comprised of the cylindrical lens 33 ad focusing lens 35, to serve a dual function. In a first function the lenses 33 and 35 cooperate to convert the master laser beam 19 into a slit-like shape to injection-lock the array 21 to the frequency (or wavelength) of the master laser 17. In a second function the lenses 35 and 33 cooperate to convert the diffraction-limited lobe or beam 41 (dashed lines) of the emission from the array 21 into a beam of circular cross section which is focused onto a mirror 43 for subsequent processing. The mirror 43 is positioned at a point where the lens 33 focuses the output beam 41 of the array 21 in front of the Faraday isolator 37, but beneath the optical path of the master laser beam 19. As a result, the mirror 43 only intercepts the single, diffraction-limited lobe or beam 41 from the array 21.

Upon being reflected from the mirror 43, the beam 41 starts to diverge and is deflected by another mirror 45 into a lens 47 which has an exemplary 6 cm (centimeter) local length. Lens 47 focuses the beam 41 into a nonlinear crystal 49. For purposes of this description, the nonlinear crystal 49 is an exemplary a-cut, 3 by 3.7 by 6 mm (millimeter) $KNbO_3$ (potassium miobate) crystal. The $KnbO_3$ crystal 49 is mounted in an enclosure 51. A temperature control unit 53 controls the temperature of the enclosure 51 (and hence the crystal 49) within a 0.1 degree centigrade (C) accuracy of a desired temperature to enable the $KNbO_3$ crystal 49 to be temperature-tuned to operate as a frequency doubler.

After undergoing transmission losses in the various optical elements (lenses 35 and 33, mirrors 43 and 45 and lens 47), approximately 270 mW of the single lobe 840 nm light (from the approximately 300 mW total CW output power from the array 21) is coupled into the KNbO$_3$ crystal 49.

A wavelength-dependent temperature tuning of the KNbO$_3$ crystal 49 (by use of the temperature control unit 53) provides a phase matching at −22.75 degrees C. for the wavelength of 840 nm. This phase matching condition provides the optimum second harmonic generation for the indices of refraction for orientation, polarization and propagation direction of the fundamental and second harmonic beams.

Figure 2:
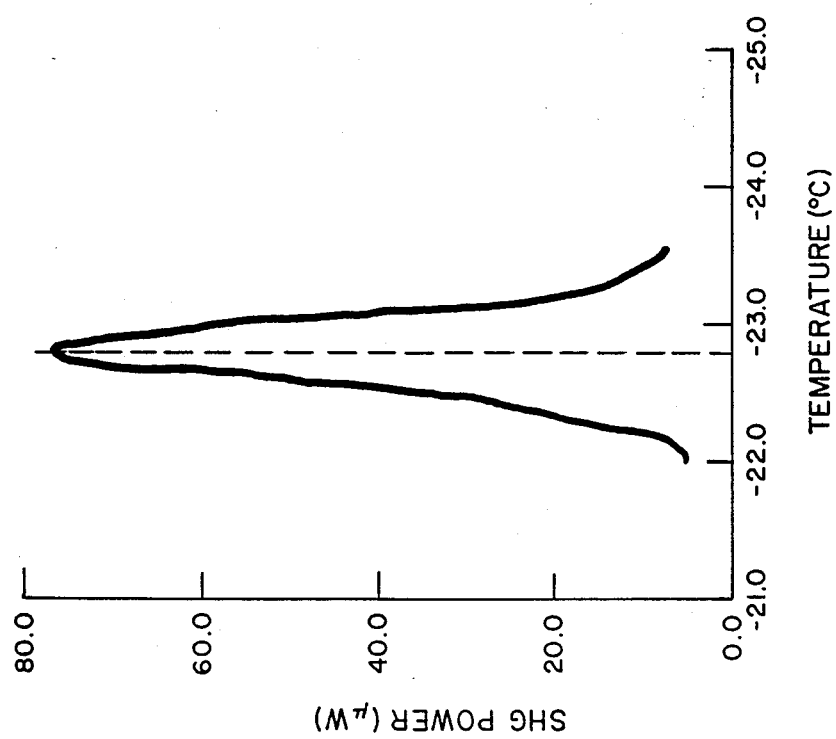
FIG. 2 illustrates a waveform useful in understanding the operation of the nonlinear crystal of FIG. 1.

FIG. 2 illustrates the second harmonic generation (SHG) of power by the KNbO$_3$ crystal 49 as a function of the temperature of the KNbO$_3$ crystal 49. Note that the optimum value of such SHG power occurs when the temperature of the KNbO$_3$ crystal 49 is −22.75 degrees C.

With an input 270 mW of 840 nm CW light coupled into the KNbO$_3$ crystal 49, approximately 0.7 mW of 420 nm light can be obtained from the KNbO$_3$ crystal 49. This is approximately a 30 dB improvement in SHG power over the SHG power described in the above-mentioned published article of J.-C. Baument et al., wherein a CW diode laser was used. Thus, the direct frequency doubling of a GaAlAs diode laser array emission in the 760–990 nm spectral range, and preferably in the 780–880 nm spectral range, provides an efficient generation of "blue" light in the 380–495 nm spectral range, and preferable in the 390–440 nm spectral range.

It should be noted at this time that the above-described nonlinear crystal 49 operates in a single-pass, nonlinear crystal configuration wherein radiation from the lens 47 substantially passes through the crystal 49 without reflection in the opposite direction. In addition to the single-pass, nonlinear configuration of the crystal 49, the crystal 49 could be modified to include mirror coatings (not shown) on its opposite faces 48 and 50 to form a resonent Fabry-Perot cavity (not shown) that is well known in the art. Thus, the diffraction-limited beam 41 from the array 21 can be used to pump such a Fabry-Perot cavity. Such pumping results in a resonant enhancement of the pump beam intensity inside of the modified crystal to increase the nonlinear mixing efficiency of the modified crystal.

The SHG output beam 55 of the KNbO$_3$ crystal 49 is applied to a collimating lens 57 which collimates and applies the beam 55 to a prism 59. Prism 59 separates the beam 55 into its infrared light beam 61 at a wavelength of 840 nm and the blue or second harmonic light beam 63 (of the infrared light), which has a wavelength of 420 nm.

A bandpass filter 65 is disposed in the optical path of the output radiation from the nonlinear crystal 49 to only pass the desired wavelength and reject other wavelengths outside of its pass-band.

In an alternate arrangement in FIG. 1, a broad stripe laser diode (not shown) can be substituted for the semiconductor diode laser array 21 to generate the diffraction-limited high power beam 41. In such a broad stripe laser, the active or gain region (not shown) is not segmented into individual stripes, as it is in the array 21, but is uniform across the whole active region. Upon being injection-locked by an external beam, a broad stripe laser would emit a diffraction-limited beam which would be used to pump the nonlinear crystal 49 in the same way as the diffraction-limited output of the injection-locked array 21 was used to pump the crystal 49.

In a second alternate arrangement in FIG. 1, a diode array amplifier arrangement (not shown) can be substituted for the semiconductor diode laser array 21. Such a diode array amplifier structure would amplify the output injection beam from the master laser 17 to provide the diffraction-limited high power beam 41. However, the diode array amplifier structure would not support laser action on its own. This diode array amplifier structure can be made by lowering the reflectivities of the facets (not shown) of the structure to suppress any lasing action by the appropriate deposition of dielectric film (not shown) onto the facets.

Figure 3:
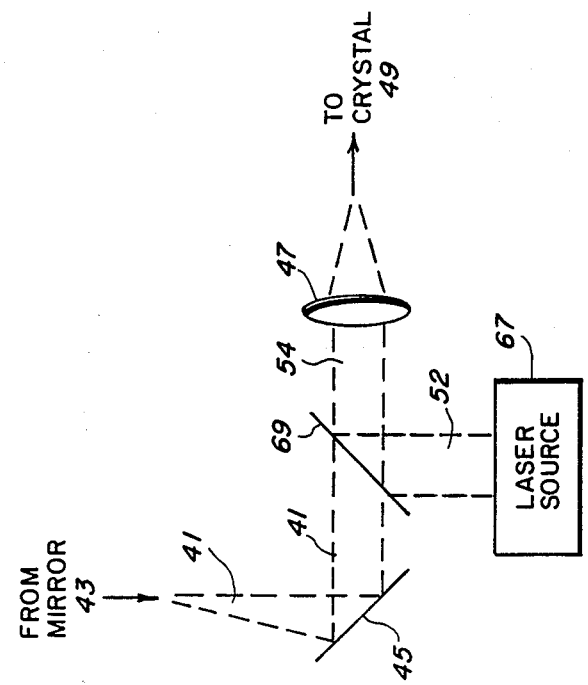
FIG. 3 illustrates a modification of the embodiment of FIG. 1.

FIG. 3 illustrates a modification of the embodiment of FIG. 1. In the modification of FIG. 3 a laser source 67 feeds its emission or beam 52 to a dichroic mirror 69 which is disposed between the mirror 45 and lens 47.

The laser source 67 can be a single laser, a broad stripe laser diode, an injection-locked array or an injection-locked broad stripe laser diode. The dichroic mirror 69 has the property of transmitting the diffraction-limited beam 41 that is received from the mirror 45 and reflecting the emission or beam 52 that is received from the laser source 67.

In operation, the dichroic mirror 69 combines the beams 41 and 52 into a combined beam 54 which is focused by the lens 47 into the nonlinear crystal 49 (FIG. 1). As a result, nonlinear mixing takes place in the crystal 49 to generate the sum and difference frequencies of the frequencies of the beams 41 and 52. In this case the crystal 49 is material-selected and temperature-tuned to produce the desired sum and difference frequencies. The crystal 49 that is used in such a nonlinear mixing operation can be, for example, potassium niobate, beta barium borate (BBO), potassium titanyl phosphate, or any other suitable nonlinear crystal. The only requirement in the selection of a nonlinear crystal 49 is that the incident and mixed radiations have to be phase-matched in the crystal in order to obtain an efficient conversion of the sum and difference frequencies from the two input incident frequencies.

The output beam 55 (FIG. 1) of the crystal 49 is collimated by the lens 57 (FIG. 1) and applied to the prism 59 (FIG. 1) to separate the beam 55 into its sum and difference components. The bandpass filter 65 (FIG. 1) is positioned to only pass the desired wavelength of the sum and difference frequency components and reject other wavelengths outside of its pass-band.

Therefore, what has been described in a preferred embodiment is a solid state, efficient, compact, wavelength conversion apparatus for the efficient generation of laser radiation at a high power output by the frequency conversion of the output of an injection-locked semiconductor diode structure (injection-locked diode laser array, injection-locked broad stripe diode laser or a semiconductor diode array amplifier structure). Such a frequency conversion at a high power output and efficiency cannot be obtained with a laser alone. The apparatus takes advantage of the high electrical-to-optical efficiency of a semiconductor diode laser (or a semiconductor diode) and utilizes the high power and diffraction-limited beam output characteristics of an externally injection-locked semiconductor diode structure which has a large active area. In a modification of the preferred embodiment the output of the injection-locked laser diode structure is mixed in a nonlinear crystal with the output of a laser source to produce a desired sum or difference frequency.

It should therefore readily be understood that many modifications and variations of the present invention are possible within the purview of the claimed invention. It is therefore to be understood that, within the scope of the appended claims, the invention may be practiced otherwise than as specifically described.

What is claimed and desired to be secured by Letters Patent of the United States is:

1. An apparatus for generating output laser power at a desired frequency, said apparatus comprising:
   injection-locked laser diode means having a large active area for emitting a diffraction-limited beam at a preselected frequency;
   optical means for focusing said diffraction-limited beam into a focused beam; and
   means responsive to said focused beam for developing an output beam at a desired frequency, said developing means including: frequency multiplying means responsive to said focused beam for producing a beam of laser power which includes said output beam at a desired harmonic of said preselected frequency, and means for passing said output beam in a given direction.

2. The apparatus of claim 1 wherein:
   said frequency multiplying means includes a nonlinear crystal for producing the desired harmonic of said preselected frequency, said desired harmonic of said preselected frequency having a wavelength within the 380 to 495 nm spectral range wavelength within the 390 to 440 nm spectral range.

3. The apparatus of claim 1 wherein:
   said frequency multiplying means includes a nonlinear crystal which is responsive to said focused beam for producing said beam of laser power which includes said output beam at said desired harmonic of said preselected frequency; and
   said passing means includes: a collimating lens for collimating said output beam, and a prism for directing only said output beam into said given direction.

4. The apparatus of claim 3 further including:
   filter means interposed between said prism and said given direction for passing said output laser beam therethrough and for blocking all optical radiation outside of a preselected bandpass around said desired harmonic of said preselected frequency.

5. The apparatus of claim 1 wherein said frequency multiplying means includes:
   a nonlinear crystal for producing the second harmonic of said preselected frequency.

6. The apparatus of claim 5 wherein said nonlinear crystal comprises:
   a $KNbO_3$ crystal.

7. The apparatus of claim 1 wherein said frequency multiplying means comprises:
   a nonlinear crystal; and
   means for controlling the temperature of said nonlinear crystal to cause said nonlinear crystal to produce a maximized amount of power at said desired harmonic of said preselected frequency.

8. The apparatus of claim 7 wherein said nonlinear crystal comprises:
   a $KNbO_3$ crystal.

9. The apparatus of claim 1 wherein said passing means comprises:
   a prism for substantially directing said output laser beam into said given direction and for substantially directing the remainder of said output beam of laser power into at least one other direction.

10. The apparatus of claim 9 further including:
    filter means interposed between said prism and said given direction for passing said output laser beam therethrough and for blocking all optical radiation outside of a preselected bandpass around said desired harmonic of said preselected frequency.

11. An apparatus for generating output laser power at a desired frequency, said apparatus comprising:
    injection-locked laser diode means having a large active area for emitting a diffraction-limited beam at a preselected frequency;
    optical means for focusing said diffraction-limited beam into a focused beam; and
    means responsive to said focused beam for developing an output beam at a desired frequency, said developing means including: laser means for emitting a laser beam at a second preselected frequency, frequency mixing means responsive to said focused beam and to said laser beam for generating sum and difference frequencies of said focused and laser beams, and means for selecting a desired on of said sum and difference frequencies as said desired frequency of said output beam.

12. The apparatus of claim 11 wherein said frequency mixing means includes:
    a nonlinear crystal responsive to said focused beam and to said laser beam for producing a composite beam comprised of sum and different frequencies of said focused and laser beams;
    a collimating lens for collimating said composite beam; and
    a prism for only passing said output beam in a given direction, said output beam being at said desired one of said sum and difference frequencies.

13. The apparatus of claim 12 further including:
    a dichroic mirror for causing said diffraction-limited beam and said second laser beam to form a combined beam propagating in the same direction; and
    a lens for focusing said combined beam into said nonlinear crystal to enable said nonlinear crystal to develop said composite beam.

14. An apparatus for generating output laser power at a desired frequency, said apparatus comprising:
    injection-locked laser diode means having a large active area for emitting a diffraction-limited beam at a preselected frequency, said injection-locked laser diode means comprising a master laser for emitting a laser beam at said preselected frequency, a semiconductor diode laser array being injection-locked by said laser beam from said master laser with said injection-locked array emitting said diffraction-limited beam at said preselected frequency, and means for shaping and focusing said laser beam from said master laser onto said array of semiconductor diode lasers to injection-lock said array;
    optical means for focusing said diffraction-limited beam into a focused beam; and
    means responsive to said focused beam for developing an output beam at a desired frequency, said developing means including: frequency multiplying means responsive to said focused beam for producing a beam of laser power which includes said output beam at a desired harmonic of said preselected frequency, and means for passing said output beam in a given direction.

15. The apparatus of claim 14 wherein said semiconductor diode laser array comprises:
an array of GaAlAs diode lasers.

16. The apparatus of claim 14 wherein said array has an array facet containing the edge of a single array junction plane and wherein said means for shaping and focusing said laser beam comprises:
a focusing lens that focuses the laser beam from said master laser;
Faraday isolator means for isolating said master laser from laser radiation emitted by said array;
a cylindrical lens that narrows the laser beam along a plane parallel to the length of said array junction plane; and
a focusing lens for focusing the narrowed laser beam onto the edge of said junction plane to injection-lock said array of semiconductor laser diodes to said preselected frequency.

17. The apparatus of claim 16 wherein said Faraday isolator means includes:
a half wave plate for rotating the polarization of the focused laser beam from said mater laser by 45 degrees in a first direction; and
a Faraday isolator for passing said focused laser beam therethrough toward said array and for preventing any light from being passed therethrough back to said master laser.

18. The apparatus of claim 16 wherein:
said frequency multiplying means includes a nonlinear crystal which is responsive to said focused beam of laser radiation for producing an output beam of laser power which includes said output laser beam at said desired harmonic of said preselected frequency.

19. The apparatus of claim 18 wherein said optical means includes:
said focusing lens for also focusing the emitted diffraction-limited beam from said array of semiconductor diode lasers;
said cylindrical lens for also narrowing and focusing the diffraction-limited beam received from said focusing lens;
a second focusing lens for focusing the diffraction-limited beam into said developing means; and
mirror means interposed between said cylindrical means and said second focusing means for reflecting the diffraction-limited beam received from said cylindrical lens to said second focusing lens.

20. An apparatus for generating output laser power at a desired frequency, said apparatus comprising:
injection-locked laser diode means having a large active area for emitting a diffraction-limited beam at a preselected frequency, said injection-locked laser diode means comprising: a master laser for emitting a laser beam at said preselected frequency, a broad stripe diode laser having a large active area for emitting a diffraction-limited beam at said preselected frequency, and means for shaping and focusing said laser beam from said master laser onto said broad stripe diode laser to injection-lock said broad stripe diode laser;
optical means for focusing said diffraction-limited beam into a focused beam; and
means responsive to said focused beam for developing an output beam at a desired frequency, said developing means including; frequency multiplying means responsive to said focused beam for producing a beam of laser power which includes said output beam at a desired harmonic of said preselected frequency, and means for passing said output beam in a given direction.

21. An apparatus for generating output laser power at a desired frequency, said apparatus comprising:
a master laser for emitting a diffraction-limited beam at a preselected frequency;
diode array means for amplifying said diffraction-limited beam;
optical means for focusing said amplified diffraction-limited beam into a focused beam; and
means responsive to said focused beam for developing an output means at a desired frequency.

* * * * *